United States Patent
Hsiao et al.

(10) Patent No.: US 10,063,251 B2
(45) Date of Patent: Aug. 28, 2018

(54) LOW-NOISE CURRENT-IN CLASS D AMPLIFIER WITH SLEW RATE CONTROL MECHANISM

(71) Applicant: MEDIATEK INC., Hsin-Chu (TW)

(72) Inventors: Chuan-Hung Hsiao, New Taipei (TW); Kuan-Ta Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/630,942

(22) Filed: Jun. 22, 2017

(65) Prior Publication Data
US 2018/0019758 A1 Jan. 18, 2018

Related U.S. Application Data

(60) Provisional application No. 62/362,612, filed on Jul. 15, 2016.

(51) Int. Cl.
| | |
|---|---|
| *H03M 1/00* | (2006.01) |
| *H03M 1/74* | (2006.01) |
| *H03F 3/217* | (2006.01) |
| *H03F 3/30* | (2006.01) |

(52) U.S. Cl.
CPC .......... *H03M 1/742* (2013.01); *H03F 3/2171* (2013.01); *H03F 3/2173* (2013.01); *H03F 3/304* (2013.01); *H03F 3/3035* (2013.01); *H03M 1/001* (2013.01); *H03F 2203/45238* (2013.01)

(58) Field of Classification Search
None
See application file for complete search history.

(56) References Cited

U.S. PATENT DOCUMENTS

| | | | |
|---|---|---|---|
| 7,262,658 B2 | 8/2007 | Ramaswamy et al. | |
| 7,295,063 B2 | 11/2007 | Kurokawa | |
| 7,339,425 B2 | 3/2008 | Yang | |
| 7,446,603 B2 | 11/2008 | Wong et al. | |
| 8,553,909 B2 | 10/2013 | Fortier et al. | |
| 8,598,906 B2* | 12/2013 | van der Goes | H03K 19/0005 326/30 |
| 9,595,931 B2* | 3/2017 | Mallinson | H03F 1/34 |
| 9,680,429 B2* | 6/2017 | Berkhout | H03F 3/387 |
| 2004/0254663 A1* | 12/2004 | Dame | H04R 3/00 700/94 |

(Continued)

OTHER PUBLICATIONS

Ido, "A Digital Input Controller for Audio Class-D Amplifiers with 100W 0.004% THD+N and 113dB DR", 2006 IEEE International Solid-State Circuits Conference, Feb. 7, 2006.

(Continued)

*Primary Examiner* — Howard Williams
(74) *Attorney, Agent, or Firm* — Winston Hsu

(57) ABSTRACT

A circuit applied to speaker includes a tri-level current DAC and a class D amplifier. The current DAC is arranged to receive a digital signal to generate a current signal, and the class D amplifier is arranged to directly receive the current from the current DAC and to amplify the current signal to generate an output signal. SNR performance is well improved class D amplifier due to small signal noise reduced by preceding tri-level DAC. In addition, the circuit further includes a driving stage, and a gate-drain voltage of a power transistor within the driving stage can be controlled to set the appropriate slew rate.

17 Claims, 3 Drawing Sheets

(56) References Cited

U.S. PATENT DOCUMENTS

2010/0128898 A1* 5/2010 Wong .................. H03F 1/305
    381/94.5

OTHER PUBLICATIONS

Dooper, "A 3.4 W Digital-In Class-D Audio Amplifier in 0.14 um CMOS", IEEE Journal of Solid-State Circuits, Vol. 47, No. 7, Jul. 2012.
Chen, "A High-PSRR Reconfigurable Class-AB/D Audio Amplifier Driving a Hands-Free/Receiver 2-in-1 Loudspeaker", IEEE Journal of Solid-State Circuits, vol. 47, No. 11, Nov. 2012.
A. Huffenus, G. Pillonnet, N. Abouchi, F. Goutti, V. Rabary and R. Cittadini, "A high PSRR Class-D audio amplifier IC based on a self-adjusting voltage reference," 2010 Proceedings of ESSCIRC, Seville, 2010, pp. 118-121.

* cited by examiner

LOW-NOISE CURRENT-IN CLASS D AMPLIFIER WITH SLEW RATE CONTROL MECHANISM

CROSS REFERENCE TO RELATED APPLICATIONS

This application claims the priority of U.S. Provisional Application No. 62/362,612, filed on Jul. 15, 2016, which is included herein by reference in its entirety.

BACKGROUND

In order to improve signal-to-noise ratio (SNR) of a class D amplifier, a tri-level current digital-to-analog converter (DAC) is used in a circuit of an audio speaker because most current DAC cells are not connected to class D amplifier when a signal is small. However, when the tri-level current DAC is applied, an additional circuits such as a current-to-voltage converter and a programmable gain amplifier is required to positioned between the tri-level current DAC and a class D amplifier for signal conversion and DC-level shifting, and these additional circuits may contribute extra noise to the signals.

In addition, in a driving stage of the circuit of an audio speaker, a fast slew rate usually leads to less distortion, better efficiency and less switching loss, however, the fast slew rate may also induce severe Electromagnetic interference (EMI) problem.

SUMMARY

It is therefore an objective of the present invention to provide a circuit of an audio speaker, wherein a class D amplifier is able to directly receive a current generated from the current DAC, and a gate-drain capacitance of a power transistor within the driving stage is programmable, to solve the above-mentioned problems.

According to one embodiment of the present invention, a circuit applied to speaker includes a current DAC and a class D amplifier. The current DAC is arranged to receive a digital signal to generate a current signal, and the class D amplifier is arranged to directly receive the current from the current DAC and to amplify the current signal to generate an output signal. In addition, the circuit further includes a driving stage, and a gate-drain capacitance of a power transistor within the driving stage can be controlled to set the appropriate slew rate.

According to another embodiment of the present invention, a circuit comprises a DAC, an amplifier and a driving stage. The DAC is arranged for receiving a digital signal to generate an analog signal, the amplifier is arranged for generating an output signal according to the analog signal, and the driving stage is arranged for generating a driving signal according to the output signal of the amplifier, wherein a gate-drain capacitance of a transistor within the driving stage is programmable.

According to another embodiment of the present invention, a circuit comprises a DAC, an amplifier and a common voltage generator. The DAC is arranged for receiving a digital signal to generate an analog signal, the amplifier is arranged for generating an output signal according to the analog signal, and the common voltage generator is arranged for generating a common voltage to the DAC according to a common voltage used by the amplifier.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
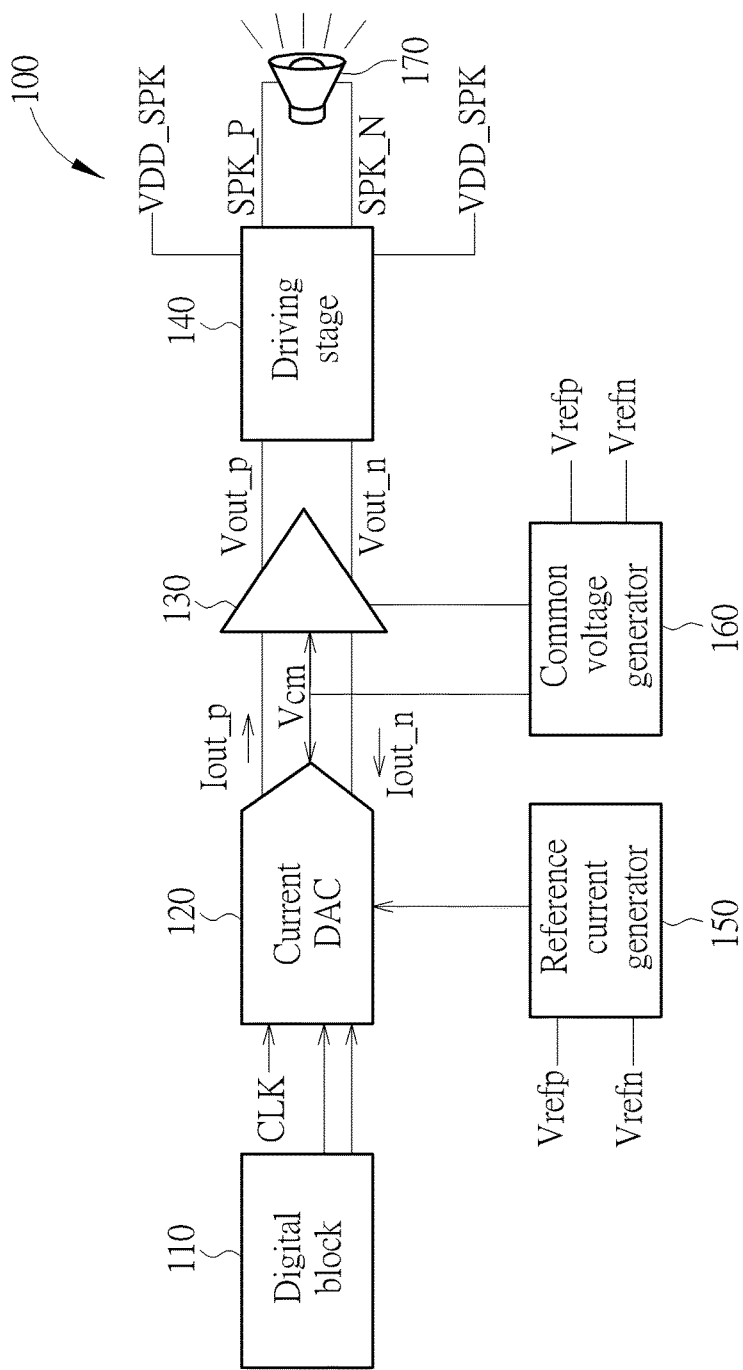
FIG. 1 is a diagram illustrating a circuit according to one embodiment of the present invention.

Please refer to FIG. 1, which is a diagram illustrating a circuit 100 according to one embodiment of the present invention. As shown in FIG. 1, the circuit 100 comprises a digital block 110, a current DAC 120, a class D amplifier 130, a driving stage 140, a reference current generator 150, a common voltage generator 160 and a speaker 170. In this embodiment, the current DAC 130 is a tri-level current DAC, and the class D amplifier 130 directly receives current signals Iout_p and Iout_n outputted from the current DAC 130 to generate output signals Vout_p and Vout_n (voltage output) to the driving stage 140.

In the operations of the circuit 100 shown in FIG. 1, firstly, the digital block 110 generates a digital audio signal to the current DAC 120, and the current DAC 120 receives a clock signal CLK, a reference current generated from the reference current generator 150 and the digital audio signal to generate two current signals Iout_p and Iout_n. Then, the class D amplifier 130 receives the current signals Iout_p and Iout_n to generate output signals Vout_p and Vout_n, and the driving stage 140 generates driving signals SPK_P and SPK_N to drive the speaker 170. In addition, the reference current generator 150 generates reference current according to at least two reference voltages Vrefp and Vrefn (DC voltages), and the common voltage generator 160 generates a common voltage Vcm to the to the current DAC 120 and the class D amplifier 130, where the common voltage Vcm is an average of the two reference voltages Vrefp and Vrefn (i.e. Vcm=(Vrefn+Vrefp)/2) used by the current DAC 120.

Comparing to the conventional circuit described in the background, the embodiment shown in FIG. 1 does not have a current-to-voltage converter and a programmable gain amplifier between the current DAC 120 and the class D amplifier 130, therefore, the extra noise can be reduced. In addition, because supply voltages of the current DAC 120 and the driving stage 140 are not the same (the driving voltage 140 is supplied by VDD_SPK and VSS_SPK, and the supply voltage VDD_SPK is larger, such as 4.5V or 9V to support large output power of speaker 170), directly removing the current-to-voltage converter and the programmable gain amplifier may cause inappropriate DC voltages of the output nodes of the current DAC 120 due to a feedback loop of the class D amplifier 130, and a headroom of the current DAC 120 may be reduced. It may also lead to unbalanced PMOS and NMOS's output impedance of the current DAC 120. Therefore, one of the topics of the present invention is to provide a design of the class D amplifier 130 and the common voltage setting of the current DAC 120, to solve the problem. In addition, because the internal circuits and the reference voltages Vrefp and Vrefn of current DAC 120 are known by a person skilled in the art, the following descriptions focus on the design of the class D amplifier 130.

Figure 2:
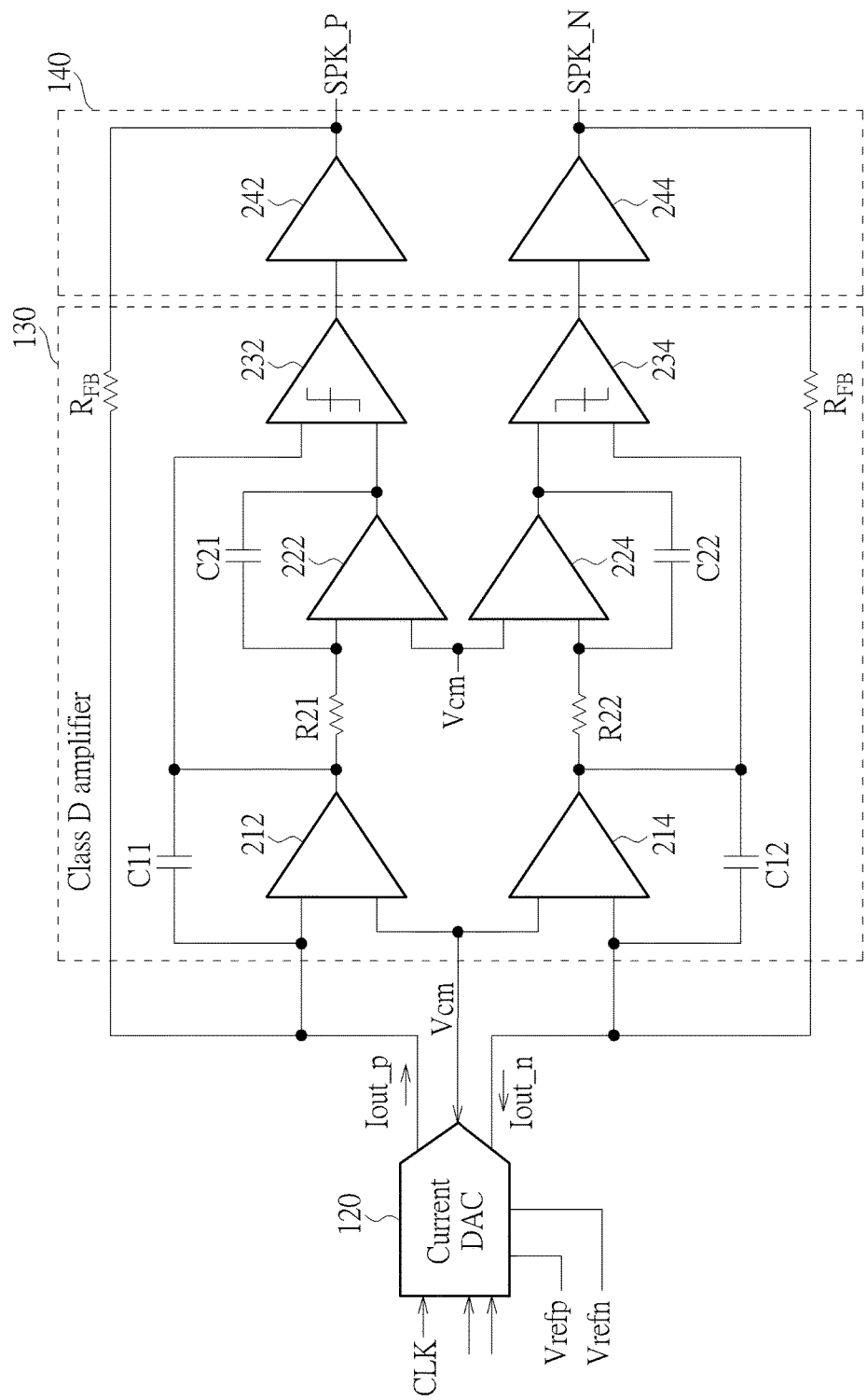
FIG. 2 is a diagram illustrating the current DAC, the class D amplifier and the driving stage according to one embodiment of the present invention.

Please refer to FIG. 2, which is a diagram illustrating the current DAC 120, the class D amplifier 130 and the driving stage 140 according to one embodiment of the present invention. As shown in FIG. 2, the class D amplifier 130 has a two stage class D architecture, where operational amplifiers 212 and 214 and two capacitors C11 and C12 serve as a first integration stage, operational amplifiers 222 and 224, two resistors R21 and R22 and two capacitors C21 and C22 serve as a second integration stage, comparators 232 and 234 are arranged to generate PWM signals; and gain amplifiers 242 and 244 serve as the driving stage 140 to generate the driving signals SPK_P and SPK_N, and resistors $R_{FB}$ on feedback loops also serve as voltage dividers to make the input nodes of the class D amplifier 130 have appropriate values. In this embodiment, the first integration stage has a pseudo-differential architecture, that is a first input node of the operational amplifier 212 and a first input node of the operational amplifier 214 receive the DAC output current signals Iout_p and Iout_n distracting from SPK output feedback currents (i.e. currents generated according to the driving signals SPK_P and SPK_N), respectively, and a second input node of the operational amplifier 212 and a second input node of the operational amplifier 214 are connected together to have a well-defined common voltage (common-mode voltage); and the second integration stage also has a pseudo-differential architecture, that is a first input node of the operational amplifier 222 and a first input node of the operational amplifier 224 receive output signals of the operational amplifiers 212 and 214, respectively, and a second input node of the operational amplifier 222 and a second input node of the operational amplifier 224 are connected together to have a common voltage, where this common voltage is the same as the common voltage that applied to the current DAC 120.

In the embodiment shown in FIG. 2, the common voltage Vcm of the current DAC 120 can be directly served by the common voltage generator 160, where the Vcm is the same as the virtual ground voltage at the second input node of the operational amplifier 212 and the operational amplifier 214, or the virtual ground voltage at the second input node of the operational amplifier 222 and the operational amplifier 224. By letting the input common voltage of the class D amplifier 130 equal to the common voltage of the current DAC 120, because the common voltage Vcm will not change if the supply voltage VDD_SPK is varying, the headroom of the current DAC 120 will not be influenced due to the supply voltage VDD_SPK, and an output impedance of the current DAC 120 can always remain the same.

In the embodiment shown in FIG. 2, the input common voltage of the class D amplifier 130 directly serve as the common voltage Vcm of the current DAC 120, however, it is not a limitation of the present invention. In other embodiments of the present invention, as long as the common voltage Vcm is generated according to the input common voltage of the class D amplifier 130, and the common voltage Vcm and the input common voltage of the class D amplifier 130 have a predetermined relationship, the alternative designs shall fall within the scope of the present invention.

Figure 3:
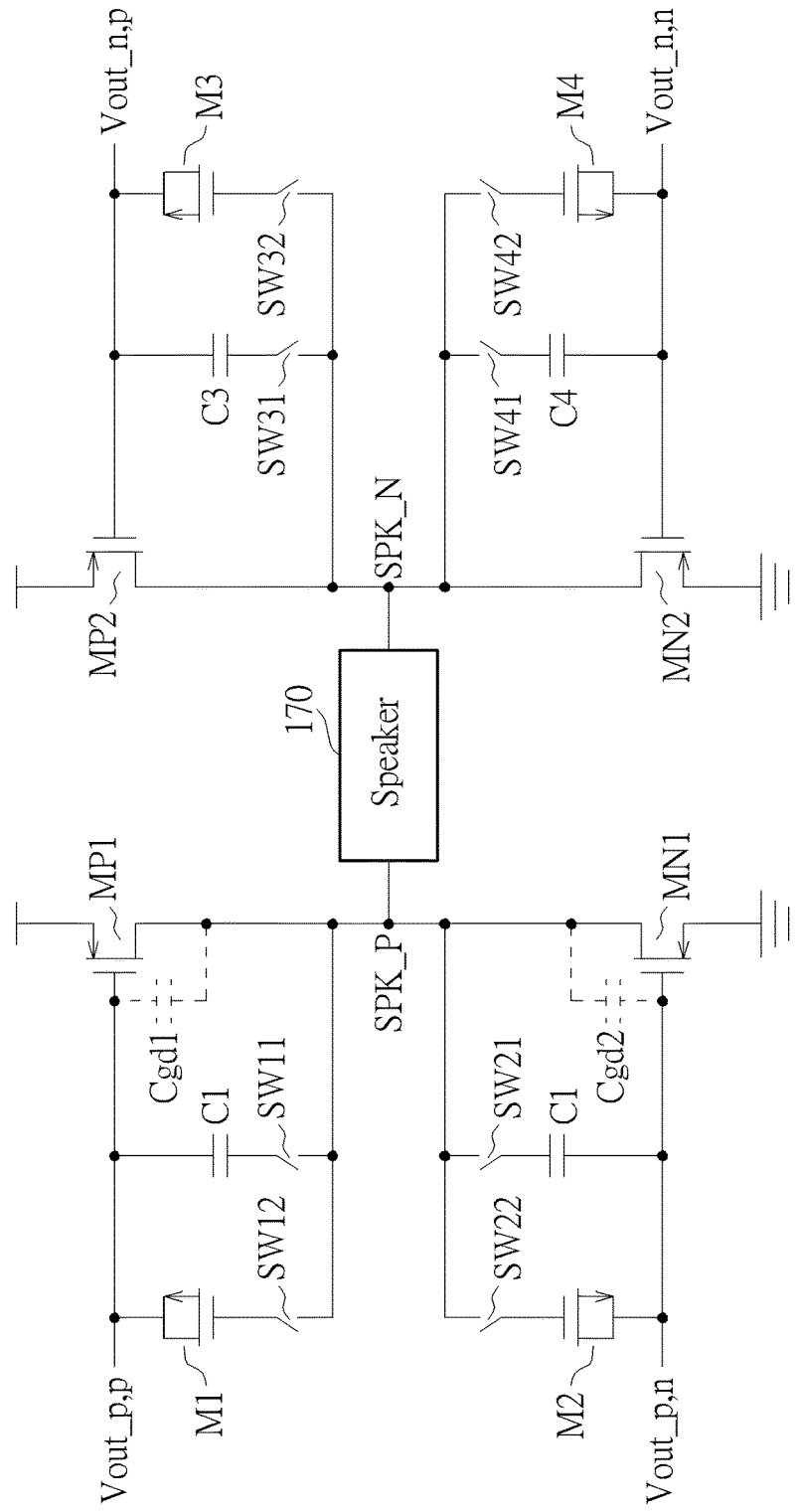
FIG. 3 shows the driving stage according to one embodiment of the present invention.

FIG. 3 shows the driving stage 140 according to one embodiment of the present invention. In FIG. 3, the driving stage 140 comprises a first driving circuit for receiving output signals Vout_p,p and Vout_p,n to generate the driving signal SPK_P of the speaker 170, and a second driving circuit for receiving output signals Vout_n,p and Vout_n,n to generate the driving signal SPK_N of the speaker 170, wherein the output signals Vout_p,p and Vout_p,n and the output signals Vout_n,p and Vout_n,n are generated from the output signals Vout_p and Vout_n shown in FIG. 1, and they are belonging to different power domains. The first driving circuit comprises a PMOS MP1, an NMOS MN1, a first switched capacitor circuit comprising two capacitors C1 and M1 and corresponding switches SW11 and SW12, and a second switched capacitor circuit comprising two capacitors C2 and M2 and corresponding switches SW21 and SW22. The second driving circuit comprises a PMOS MP2, an NMOS MN2, a third switched capacitor circuit comprising two capacitors C3 and M3 and corresponding switches SW31 and SW32, and a fourth switched capacitor circuit comprising two capacitors C4 and M4 and corresponding switches SW41 and SW42. In addition, "Cgd1" and "Cgd2" shown in FIG. 3 are parasitic capacitance of the PMOS MP1 and NMOS MN1, respectively.

The switches SW11, SW12, SW21, SW22, SW31, SW32, SW41 and SW42 can be turned on or off according to digital control signals, respectively, to make the PMOSs MP1 and MP2 and NMOSs MN1 and MN2 have the appropriate gate-drain capacitance to achieve the desired slew rate. For example, assuming that the output signal Vout_p,p goes from 0V to 10V, the parasitic capacitance Cgd1 of the PMOS MP1 is 900 fF, and the driving current is 5 mA, a slew time from 1V to 9V of the driving signal SPK_P of the driving stage 140 is about 1.44 ns, which is so fast that the severe EMI may be induced. Therefore, the switch SW11 and/or SW12 may be turned on to increase the capacitance of the PMOS MP1 to increase the slew time to reduce the EMI.

By using the programmable gate-drain capacitance of the PMOS/NMOS of the driving stage 140, the slew rate of the driving signals can be controlled to have the appropriate setting, and a tradeoff between the efficiency and EMI problem can be more flexible.

Briefly summarized, in the embodiments of the present invention, the class D amplifier can be designed to directly receive the output currents from the tri-level current DAC to reduce noise at small signal input, and the conventional current-to-voltage converter and programmable gain amplifier between the current DAC and the class D amplifier can be removed to reduce the extra circuit noise. In addition, a programmable gate-drain capacitance of the power transistor is provided in the driving stage to have the appropriate slew rate setting.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit, comprising:
   a current digital-to-analog converter (DAC), for receiving a digital signal to generate a current signal;
   a class D amplifier, coupled to the current DAC, for receiving the current signal from the current DAC and amplifying the current signal to generate an output signal; and
   a driving stage, coupled to the class D amplifier, for generating a driving signal according to the output signal of the class D amplifier, wherein a gate-drain capacitance of a transistor within the driving stage is programmable.

2. The circuit of claim 1, wherein the class D amplifier has a pseudo-differential amplifier, and a common voltage applied to the pseudo-differential amplifier also serves as a common voltage of the current DAC.

3. The circuit of claim 1, wherein further comprising:
   a common voltage generator, coupled to the current DAC and the class D amplifier, for generating a common voltage to the current DAC and the class D amplifier.

4. The circuit of claim 3, wherein the class D amplifier has a pseudo-differential integration stage, and the common voltage generator generates the common voltage to the current DAC and the class D amplifier according to a common voltage of reference voltages of the current DAC.

5. The circuit of claim 1, wherein the current signal comprises a first current signal and a second current signal, and the class D amplifier comprises:
   a pseudo-differential integration stage comprising a first operational amplifier and a second operational amplifier, wherein a first node of the first operational amplifier is arranged to receive the first current signal, a first node of the second operational amplifier is arranged to receive the second current signal, and a second node of the first operational amplifier is connected to a second node of the second operational amplifier.

6. The circuit of claim 5, wherein a DC voltage at the second node of the first/second operational amplifier is also applied to a common voltage of the current DAC.

7. The circuit of claim 5, further comprising:
   a common voltage generator, coupled to the current DAC and the class D amplifier, for generating a common voltage to the current DAC and the second node of the first/second operational amplifier.

8. The circuit of claim 1, wherein the driving stage comprises:
   a PMOS, wherein a gate electrode of the PMOS receives the output signal of the class D amplifier, a source electrode of the PMOS is coupled to a supply voltage, and a drain electrode of the PMOS is coupled to an output node of the driving stage;
   a first switched capacitor circuit, coupled between the gate electrode and the drain electrode of the PMOS, for providing a variable capacitance to a gate-drain voltage of the PMOS;
   an NMOS, wherein a gate electrode of the NMOS receives the output signal of the class D amplifier, a source electrode of the NMOS is coupled to a ground voltage, and a drain electrode of the NMOS is coupled to the output node of the driving stage; and
   a second switched capacitor circuit, coupled between the gate electrode and the drain electrode of the NMOS, for providing a variable capacitance to a gate-drain voltage of the NMOS.

9. The circuit of claim 1, wherein the current DAC is a tri-level current DAC.

10. The circuit of claim 1, wherein the circuit is applied to a speaker.

11. A circuit, comprising:
    a digital-to-analog converter (DAC), for receiving a digital signal to generate an analog signal; and
    an amplifier, coupled to the DAC, for generating an output signal according to the analog signal; and
    a driving stage, coupled to the amplifier, for generating a driving signal according to the output signal of the amplifier, wherein a gate-drain capacitance of a transistor within the driving stage is programmable.

12. The circuit of claim 11, wherein the driving stage comprises:
    a PMOS, wherein a gate electrode of the PMOS receives the output signal of the class D amplifier, a source electrode of the PMOS is coupled to a supply voltage, and a drain electrode of the PMOS is coupled to an output node of the driving stage;
    a first switched capacitor circuit, coupled between the gate electrode and the drain electrode of the PMOS, for providing a variable capacitance to a gate-drain voltage of the PMOS;
    an NMOS, wherein a gate electrode of the NMOS receives the output signal of the class D amplifier, a source electrode of the NMOS is coupled to a ground voltage, and a drain electrode of the NMOS is coupled to the output node of the driving stage; and
    a second switched capacitor circuit, coupled between the gate electrode and the drain electrode of the NMOS, for providing a variable capacitance to a gate-drain voltage of the NMOS.

13. The circuit of claim 11, wherein the circuit is applied to a speaker.

14. A circuit, comprising:
    a digital-to-analog converter (DAC), for receiving a digital signal to generate an analog signal; and
    an amplifier, coupled to the DAC, for generating an output signal according to the analog signal;
    a common voltage generator, coupled to the DAC and the class D amplifier, for generating a common voltage to the DAC and the amplifier; and
    a driving stage, coupled to the amplifier, for generating a driving signal according to the output signal of the amplifier, wherein a gate-drain capacitance of a transistor within the driving stage is programmable.

15. The circuit of claim 14, wherein the common voltage generator generates the common voltage to the DAC and the amplifier according to a common voltage of reference voltages of the DAC.

16. The circuit of claim 15, wherein the amplifier has a pseudo-differential integration stage, and the common voltage generator generates the common voltage to the DAC and the pseudo-differential integration stage of the amplifier.

17. The circuit of claim 14, wherein the DAC is a tri-level current DAC, the amplifier is a class D amplifier, and the circuit is applied to a speaker.

* * * * *